(12) United States Patent
Nakajima (10) Patent No.: US 6,420,741 B1
(45) Date of Patent: *Jul. 16, 2002

(54) FERROELECTRIC MEMORY HAVING ELECTROMAGNETIC WAVE SHIELD STRUCTURE

(75) Inventor: Masao Nakajima, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/527,297

(22) Filed: Mar. 17, 2000

(30) Foreign Application Priority Data

Mar. 19, 1999 (JP) .............................. 11-075791

(51) Int. Cl.⁷ .................... H01L 29/76; H01L 29/94; H01L 31/062; H01L 31/113
(52) U.S. Cl. ........................................ 257/295; 257/630
(58) Field of Search ................................ 257/295, 630

(56) References Cited

U.S. PATENT DOCUMENTS

| | | | |
|---|---|---|---|
| 3,811,076 A | 5/1974 | Smith, Jr. ............... | 317/335 R |
| 4,344,155 A | * 8/1982 | Mollier | |
| 5,060,191 A | 10/1991 | Nagasaki et al. .......... | 365/145 |
| 5,899,755 A | * 5/1999 | Kline | |
| 6,038,006 A | * 3/2000 | Sasaki et al. | |

FOREIGN PATENT DOCUMENTS

| | | |
|---|---|---|
| JP | 64-59960 | 3/1989 |
| JP | 4-35063 | 2/1992 |
| JP | 4-102367 | 4/1992 |
| JP | 6-85205 | 3/1994 |
| JP | 6-268169 | 9/1994 |
| JP | 8-46386 | 2/1996 |

* cited by examiner

Primary Examiner—Stephen D. Meier
(74) Attorney, Agent, or Firm—Armstrong, Westerman & Hattori, LLP

(57) ABSTRACT

The present invention is a ferroelectric memory chip having a memory cell region in which there is provided a plurality of memory cells, each having a ferroelectric capacitor, this ferroelectric memory chip being characterized in that there is formed an electromagnetic wave shield layer, which shields the above-mentioned memory cell region against electromagnetic waves from the outside. The electromagnetic wave shield layer is constituted, for example, from either a conductive layer, or a semiconductor layer, which is provided above and/or below the memory cell region, and preferably is connected so as to constitute the same electric potential. Providing such an electromagnetic wave shield layer eliminates the direct irradiation of electromagnetic waves on a word line, plate line and bit line inside the memory cell region, thus making it possible to prevent a change in a storage state by an unexpected electric field being applied to a ferroelectric capacitor inside a memory cell.

8 Claims, 9 Drawing Sheets

FIG. 4A
Data 1

FIG. 4B
Data 0

FERROELECTRIC MEMORY HAVING ELECTROMAGNETIC WAVE SHIELD STRUCTURE

BACKGROUND OF THE INVENTION

1. Field of the Invention

The present invention relates to a ferroelectric memory (FRAM), and more particularly, to a ferroelectric memory having an electromagnetic wave shield structure so as not to receive the effects of electromagnetic waves from outside when mounted in an IC card or the like.

2. Description of the Related Art

Ferroelectric memory makes use of the phenomenon by which, when a ferroelectric material is polarized by the application of an oriented electric field, the state of polarization thereof remains as residual polarization even when the power source is shut OFF. Such ferroelectric material can be polarized using a relatively smaller amount of energy than an electrically erasable programmable read-only memory (EEPROM) or the like, and ferroelectric memory can write, erase and read data in a shorter period of time than EEPROM or flash memory. Moreover, because ferroelectric memory is capable of retaining stored data even after power has been disconnected, it is attracting attention as a next-generation non-volatile memory. For example, ferroelectric memory is being studied for use as rewritable program ROM, and as a replacement for conventional dynamic random access memory (DRAM).

As a useful application of ferroelectric memory, it has been proposed that ferroelectric memory be mounted in integrated circuit (IC) cards, which retain large amounts of data, and have a variety of functions. Such an IC card is normally connected to an external computer in a non-contact state, and is supplied with power, and transmits and receives communications data through the use of electromagnetic waves. For this reason, an antenna for transmitting and receiving electromagnetic waves, which is connected to a ferroelectric memory chip, is provided inside an IC card.

However, to be supplied with power and to transceive data without making contact, a ferroelectric memory-mounted IC card is exposed to an electromagnetic wave of extremely high energy. This electromagnetic wave is irradiated on the built-in ferroelectric memory chip as well as the antenna inside the IC card. Inside a ferroelectric memory chip are provided a word line, a plate line, and a bit line, which is perpendicular thereto, and a memory cell having a ferroelectric capacitor is formed at the intersection thereof. In this case, because either the word line and plate line, or the bit line are laid out within the chip having a relatively long distance, the electric potential thereof can be expected to fluctuate upon the application of a high frequency voltage in accordance with an electromagnetic wave. As a result of the fluctuation of the potential of these lines, there are cases in which an electric field, the direction of which differs from that at write time, is applied to a ferroelectric capacitor connected to a plate line, and the state of stored residual polarization is either reversed or destroyed.

SUMMARY OF THE INVENTION

Accordingly, an object of the present invention is to provide a ferroelectric memory, which is constituted so that there is no fluctuation of a storage state resulting from an electromagnetic wave.

Another object of the present invention is to provide a ferroelectric memory, which is constituted so that an electromagnetic wave is not irradiated onto a ferroelectric capacitor that is storing data.

To realize the above-mentioned objects, the present invention is a ferroelectric memory chip having a memory cell region in which there is provided a plurality of memory cells, each having a ferroelectric capacitor, this ferroelectric memory chip being characterized in that there is formed an electromagnetic wave shield layer, which shields the above-mentioned memory cell region against electromagnetic waves from the outside. The electromagnetic wave shield layer is constituted, for example, from either a conductive layer, or a semiconductor layer, which is provided above and/or below the memory cell region, and preferably is connected so as to constitute the same electric potential. Providing such an electromagnetic wave shield layer eliminates the direct irradiation of electromagnetic waves on a word line, plate line and bit line inside the memory cell region, thus making it possible to prevent a change in a storage state by an unexpected electric field being applied to a ferroelectric capacitor inside a memory cell.

To realize the above-mentioned objects, the present invention is a ferroelectric memory chip having a memory cell region in which there is provided a plurality of memory cells, each having a ferroelectric capacitor, this ferroelectric memory chip comprising an electromagnetic wave shield layer, which shields the above-mentioned memory cell region against electromagnetic waves from the outside.

According to the preferred embodiment of the present invention, the above-mentioned electromagnetic wave shield layer has a line-shaped shield line, which is above at least one wire of a plurality of word lines, bit lines, and plate lines connected to each memory cell and formed in the memory cell region, and which is aligned with these lines.

The ferroelectric material of a ferroelectric capacitor is generally an oxide. Therefore, it is desirable that the generation of reduction gases be suppressed as much as possible in fabrication processes subsequent to the formation of a ferroelectric capacitor. In this case, by making the electromagnetic wave shield layer the above line shaped shield line that is aligned with a bit line or other wire as described hereinabove, it is possible to make the surface area of the electromagnetic wave shield layer as small as possible. As a result thereof, it is considered that the generation of hydrogen and other reduction gases generated during the formation of an electromagnetic wave shield layer can be reduced, and that it will be possible to put an end to generated reduction gases residing in the vicinity of a ferroelectric capacitor.

For an IC card, which is mounted with the above mentioned ferroelectric memory chip, and in which is formed an electromagnetic wave antenna for supplying power to, and transmitting/receiving data to/from this chip, it will be possible to prevent, in accordance with an in-chip electromagnetic wave shield layer, any effects to the memory cell region even when subjected to the irradiation of electromagnetic waves from outside.

DESCRIPTION OF THE PREFERRED EMBODIMENTS

Aspects of the embodiment of the present invention are explained hereinbelow by referring to the figures. However, such aspects of the embodiment do not represent the limits of the technological scope of the present invention.

Figure 1:
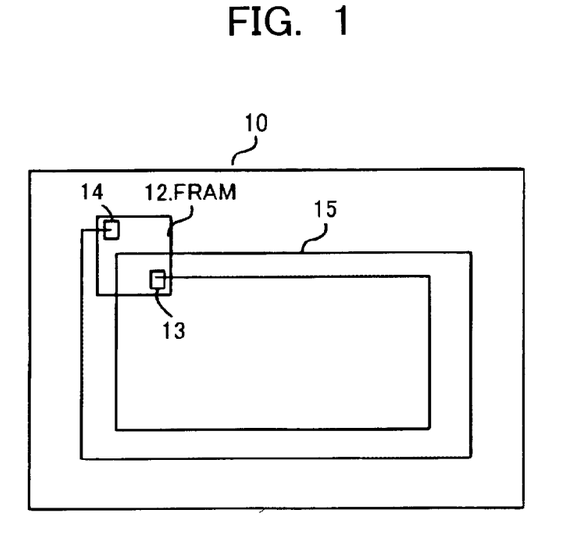
FIG. 1 is a diagram showing the constitution of a ferroelectric memory-mounted IC card in an aspect of the embodiment.

FIG. 1 is a diagram showing the structure of an IC card, which is mounted with a ferroelectric memory of the present embodiment. On the inside of an IC card 10, which was formed from molded plastic, there is mounted a ferroelectric memory chip 12, or a microprocessor chip 12 into which a ferroelectric memory is integrated. Further, connection terminals 13, 14 are formed in this chip 12, and an antenna 15 comprising a conductive material such as copper foil is formed in the shape of a coil inside the IC card 10. And by putting the IC card 10 in close proximity to an input-output device, which is connected to a computer, an electromagnetic wave from the input-output device is received via the antenna 15, and the chip 12 is supplied with power, and receives communication data. Further, the chip 12 transmits communication data to the input-output device via the irradiation of an electromagnetic wave from the antenna 15.

Figure 2:
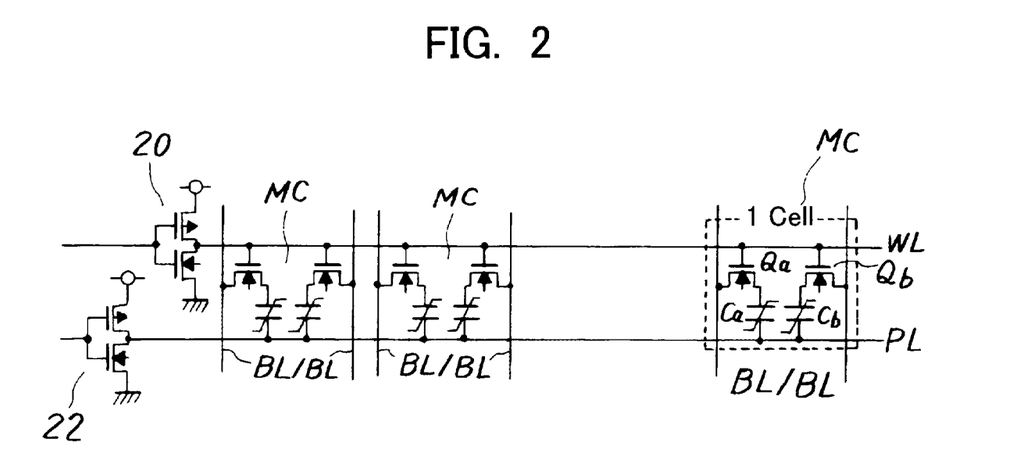
FIG. 2 is a circuit diagram of a memory cell region of a ferroelectric memory.

FIG. 2 is a circuit diagram of a memory cell region of a ferroelectric memory. This example is one in which a memory cell MC constitutes a pair of transistors Qa, Qb, and a pair of ferroelectric capacitors Ca, Cb. In FIG. 2, for the sake of simplicity, only one row of a memory cell array is shown. A memory cell is provided at the intersecting location of a word line WL and plate line PL extending in the row direction, and a pair of bit lines BL, /BL extending in the column direction. The gates of the pair of transistors Qa, Qb are connected to the word line WL, and the source or drain terminals are connected to the pair of bit lines BL, /BL. Further, ferroelectric capacitors Ca, Cb are connected to the pair of transistors Qa, Qb, and the electrodes on the opposite sides thereof are connected to the plate line PL. The word line WL is driven by a word driver 20, which constitutes a CMOS inverter, and the plate line PL is driven by a plate line driver 22, which similarly constitutes a CMOS inverter. The pair of bit lines are connected to a sense amp not shown in the figure.

In a ferroelectric memory such as this, the storage of data is performed by polarizing the ferroelectric material in a prescribed direction by driving the word line WL to H level, thus causing transistors Qa, Qb to conduct, driving the bit lines BL, /BL and plate line PL to prescribed levels, and applying an electric field of a prescribed direction to ferroelectric capacitors Ca, Cb. In the case of the memory cell having a pair of ferroelectric capacitors shown in FIG. 2, data storage is performed by polarizing the pair of ferroelectric capacitors in opposite directions.

Figure 3:
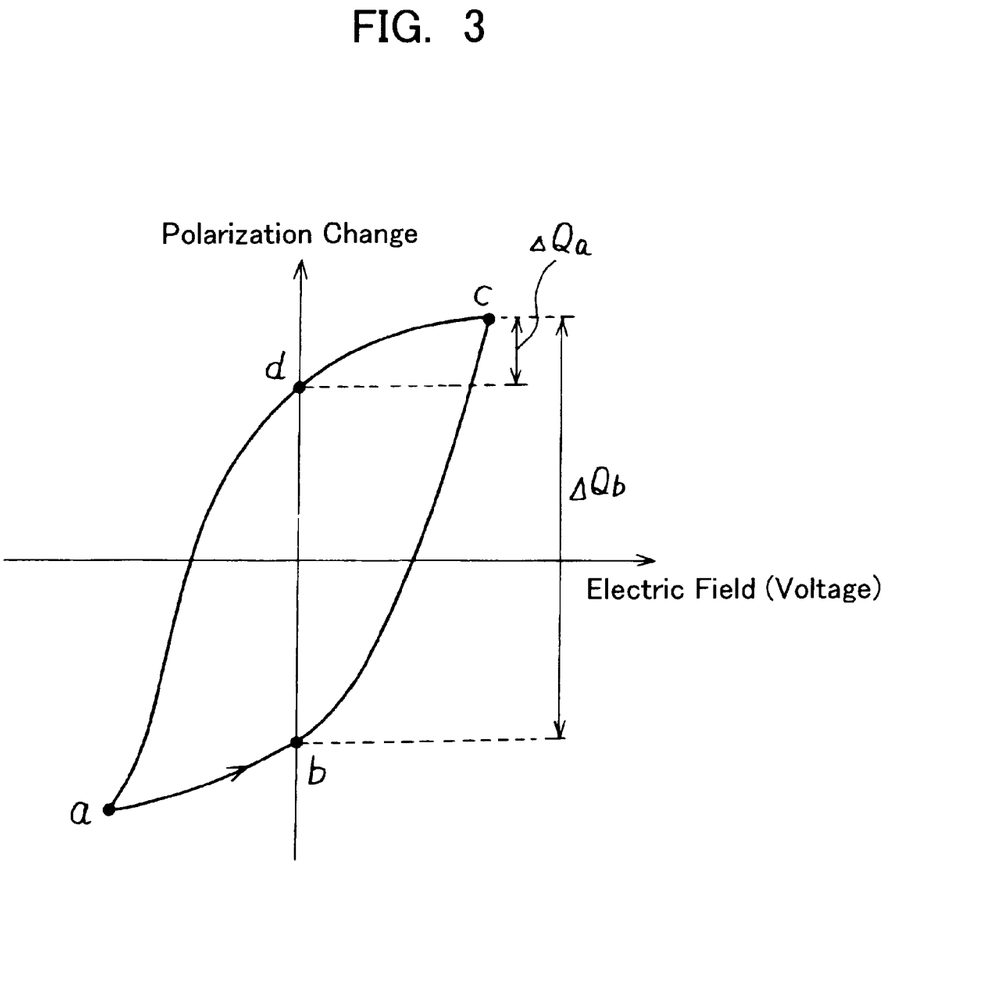
FIG. 3 is a diagram showing hysteresis characteristics in the ferroelectric material of a ferroelectric capacitor.

FIG. 3 is a diagram showing hysteresis characteristics in the ferroelectric material of a ferroelectric capacitor. The horizontal axis represents the electric field, and the vertical axis represents the polarization charge. The above-described data storage and readout are performed by making use of the hysteresis characteristics thereof. For example, when transistor Qa is made conductive by driving the word line WL to H level, a bit line BL is set to H level, and the plate line PL is set to L level, a plus-oriented electric field, for example, is applied to ferroelectric capacitor Ca. As a result thereof, ferroelectric capacitor Ca is polarized in the state of point c in FIG. 3. Thereafter, even if the word line WL is set to L level, the transistor is made nonconductive, and the electric field between the ferroelectric capacitors is removed, ferroelectric capacitor Ca retains the state of point d in FIG. 3. By contrast, applying to ferroelectric capacitor Cb an electric field of an opposite orientation to that described above in the state of point a in FIG. 3. Thereafter, even if the word line is set to L level and the transistor is made nonconductive, ferroelectric capacitor Cb retains the state of point b in FIG. 3.

Next, for readout, after the bit line pair have both been pre-charged to 0 potential, the word line WL is driven to H level making both transistors Qa, Qb of the memory cell conductive, and the plate line PL is driven from L level to H level. As a result thereof, capacitor Ca moves to the state of point c from point d in FIG. 3, and the charge of $\Delta Qa$ flows out to bit line BL. By contrast, capacitor Cb moves to the state of point c from point b in the figure, and the charge of $\Delta Qb$ flows out to bit line /BL. In accordance with the difference of the outflow charges $\Delta Qa$, $\Delta Qb$ to these bit lines, a slight potential difference is generated between the bit line pair. This slight potential difference is amplified by a sense amp connected to bit lines not shown in the figure. And then, thereafter, in accordance with the bit line potential amplified by the sense amp, rewrite is performed to the ferroelectric capacitors of the memory cell.

As described above, in a ferroelectric memory, the polarization direction thereof can be changed by applying an electric field of a prescribed orientation to a ferroelectric capacitor, and data storage can be performed in accordance with the polarization direction thereof. However, the word line, plate line, and bit lines extend across a relatively long distance in the memory cell region inside the chip. Because these lines are formed from a conductive material, such as aluminum, or polysilicon, they substantially have the same function as an antenna. Therefore, when the high energy of an electromagnetic wave is irradiated from outside, the word line, plate line and bit lines thereof are exposed to the electromagnetic wave the same as the antenna 15 inside the IC card 10. In the power OFF state, these lines are in a floating state, for example, therefore there are case in which these lines are driven to an unexpected potential by the irradiated electromagnetic wave.

Figure 4A:
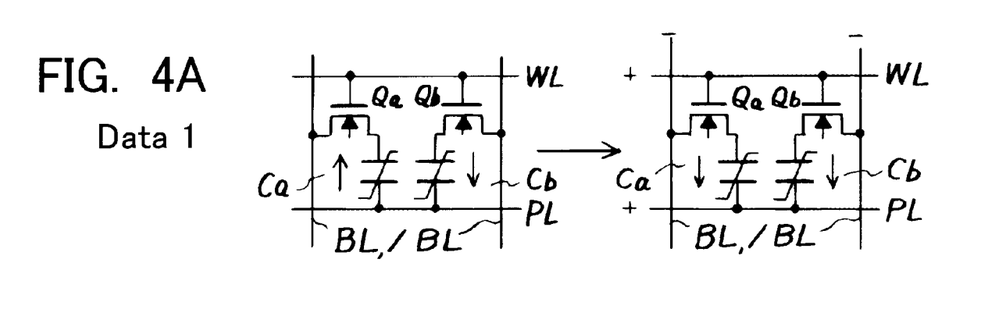
FIGS. 4A and 4B is a diagram for explaining the fact that the storage state of a memory cell changes in accordance with electromagnetic wave irradiation.
Figure 4B:
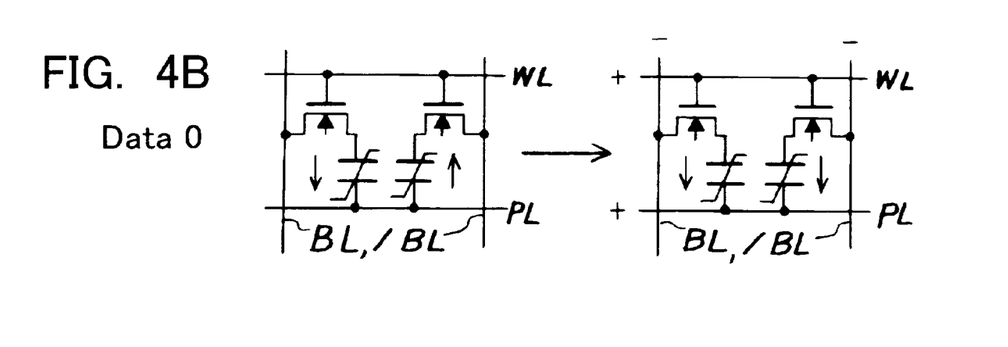

FIG. 4 is a diagram for explaining a change in a memory cell storage state resulting from electromagnetic wave irradiation. FIG. 4A shows the break down of a state in which data 1 is stored, and FIG. 4B shows the break down of a state in which data 0 is stored. Both situations assume a case, in which, when a bit line pair BL, /BL is fixed in the L level, and the word line WL and plate line PL are in floating states, a high frequency voltage is applied to the word line WL and plate line PL by the irradiation of an electromagnetic wave, causing them to rise to a positive potential.

As shown in FIG. 4A, in the state in which data 1 is stored, ferroelectric capacitor Ca is polarized upward, and by contrast reference ferroelectric capacitor Cb is polarized downward. Accordingly, when the word line WL and plate line PL are driven to a positive potential by the irradiation of an electromagnetic wave as described above, memory cell transistors Qa, Qb both conduct, and a downward electric field is applied to both capacitors Ca, Cb. As a result thereof, there are case in which the polarization direction of capacitor Ca is inverted as shown in FIG. 4A. When both capacitors Ca, Cb are polarized in the same direction, it becomes impossible to perform readout as shown in FIG. 3.

As shown in FIG. 4B, in a state in which data 0 is stored, the two capacitors are polarized in opposite directions to the above-mentioned data 1 state. When the above-mentioned electromagnetic wave irradiation is performed in this state, a downward electric field is applied to both capacitors Ca, Cb, and these are polarized in the same downward direction together. Readout also become impossible when this state is realized.

There is also a case in which a ferroelectric memory cell constitutes 1 transistor and 1 ferroelectric capacitor. In this case, a reference cell having a ferroelectric capacitor for reference use is provided on the opposite side bit line. Therefore, it is the same as the above-described 2 transistor, 2 capacitor-type memory cell in that either a memory cell storage state is inverted, and readout is made impossible by the irradiation of an electromagnetic wave, or data inversion occurs.

Figure 5:
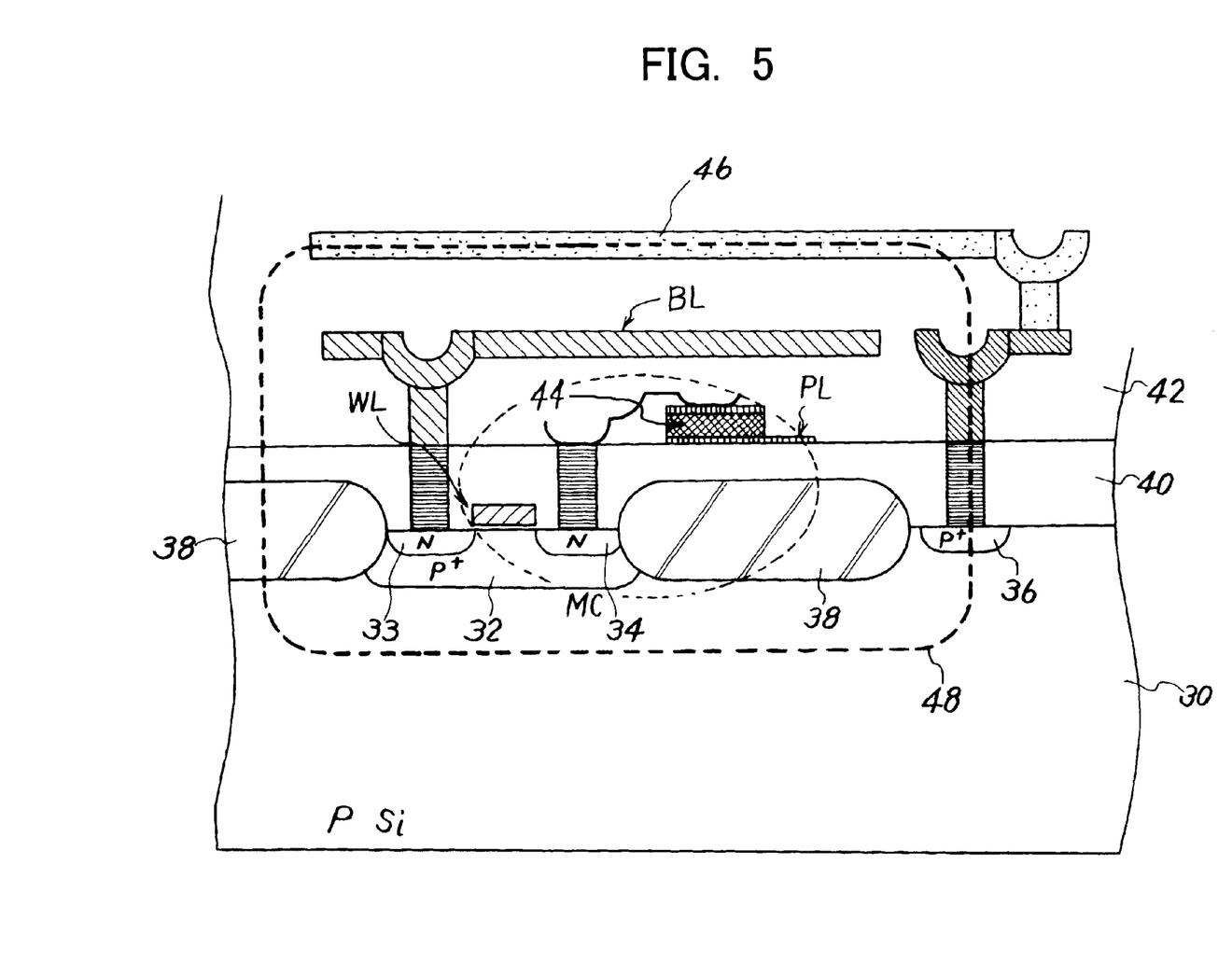
FIG. 5 is a diagram showing a cross-section of a portion of a ferroelectric memory structure in an aspect of the embodiment.

FIG. 5 is a diagram showing a cross-section of a portion of a ferroelectric memory structure in the present embodiment. On the surface of a p-type silicon semiconductor substrate 30, a p-type well region 32 is formed in a region defined by field oxide layers 38, and n-type source and drain regions 33, 34 of a memory cell transistor are also formed therein. An electrode of one side of a ferroelectric 44, which constitutes a ferroelectric capacitor, is connected to n-type region 34, and the electrode of the other side of the capacitor constitutes a plate line PL. The plate line PL is formed on an insulating layer 40 formed on the substrate 30. Further, the n-type region of the other side 33 is connected to a bit line BL. The bit line BL is formed, for example, by a first aluminum layer. The gate of the memory cell transistor constitutes a word line WL formed by a polysilicon layer. 42 is another insulating layer.

An electromagnetic wave shield layer 46 is formed in a memory cell region, in which such memory cells are formed. In this example, this electromagnetic wave shield layer 46 is formed by a second aluminum layer formed above the substrate 30, is formed above the word line WL, plate line PL, and bit line BL formed on the substrate, and shields against a high energy electromagnetic wave irradiated from outside. The electromagnetic wave shield layer 46 is also connected to the p-type substrate 30 via a p-type region 36 so as to have the same potential as the substrate. Therefore, the p-type semiconductor substrate 30 also functions as an electromagnetic wave shield layer, and has the function of shielding against an electromagnetic wave from the back side of the substrate. That is, an electromagnetic wave shield structure 48 is formed in accordance with the substrate 30 and the uppermost aluminum layer 46. The word line WL, bit line BL, and plate line PL, which are interposed between the electromagnetic wave shield structures thereof, are not exposed to an electromagnetic wave from outside, and the change of a storage state by an electromagnetic wave as explained in FIG. 4 is prevented.

Figure 6:
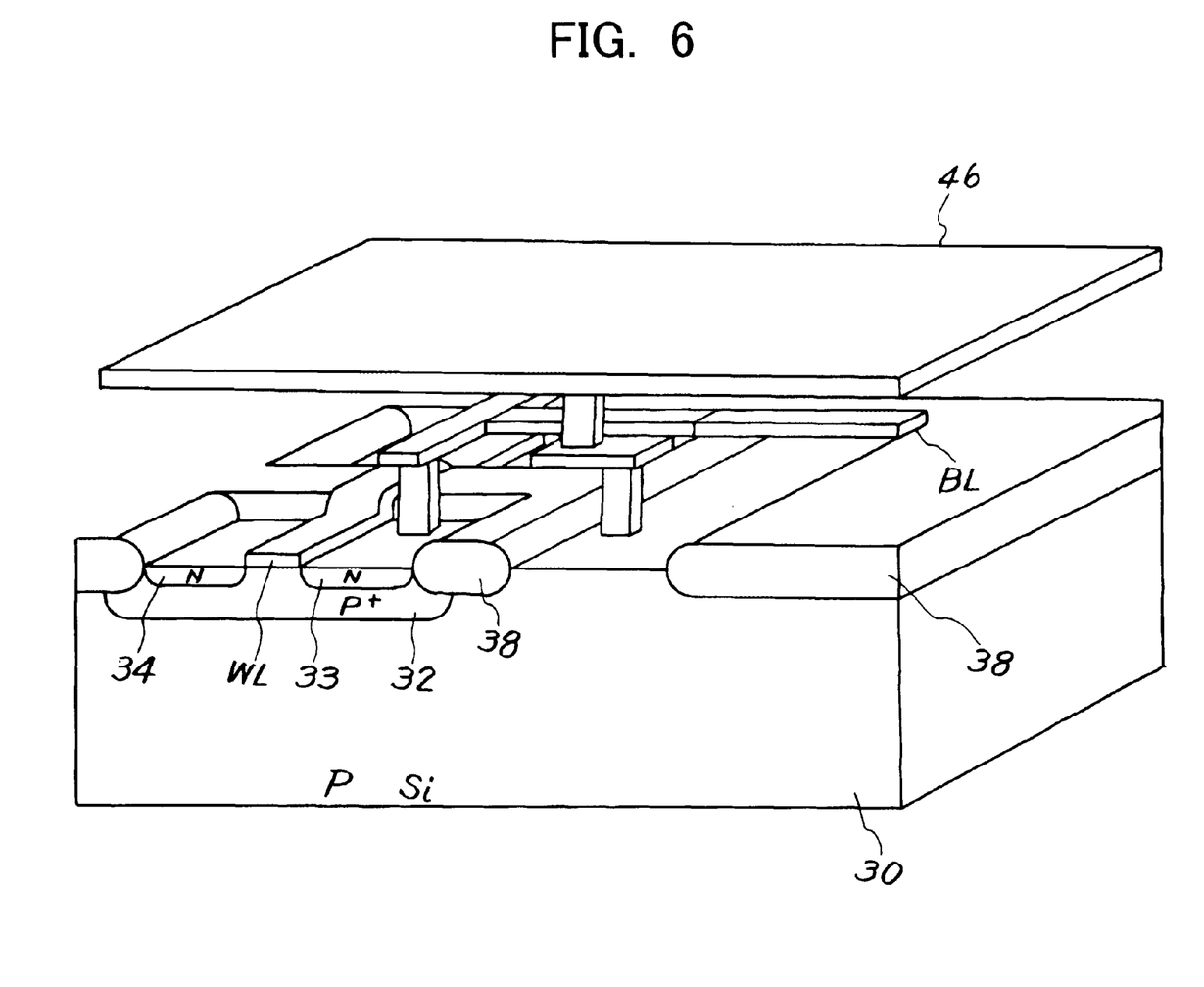
FIG. 6 is an oblique view showing the electromagnetic wave shield layer of FIG. 5.

FIG. 6 is an oblique view showing the electromagnetic wave shield layer of FIG. 5. The same reference numerals have been assigned to portions that are the same as those in FIG. 5. In FIG. 6, an electromagnetic wave shield layer 46 formed by an aluminum layer, and a bit line BL are shown. A transistor structure of a memory cell is shown on the left side of the substrate 30, and a word line WL, which constitutes the gate therefor, is shown. The ferroelectric capacitor structure has been omitted, but a plate line (not shown) is formed on the left side of the substrate 30. In the example of FIG. 6, the electromagnetic wave shield layer 46 is a flat plate structure with no openings. However, the electromagnetic wave shield layer 46 is not limited to this flat plate structure, but rather, as explained hereinbelow, can be any structure made from a conductive material that is capable of shielding against electromagnetic waves, such as a lattice structure, a comb-tooth structure, and so forth.

As is clear from FIG. 6, the word line WL, plate line PL, and bit line BL of a memory cell region are interposed between an electromagnetic wave shield layer 46 formed over the substrate 30, and a p-type semiconductor substrate 30 to which the shield layer 46 is connected. Therefore, an electromagnetic wave from the outside is not irradiated onto these conductive lines WL, PL, BL.

Figure 7:
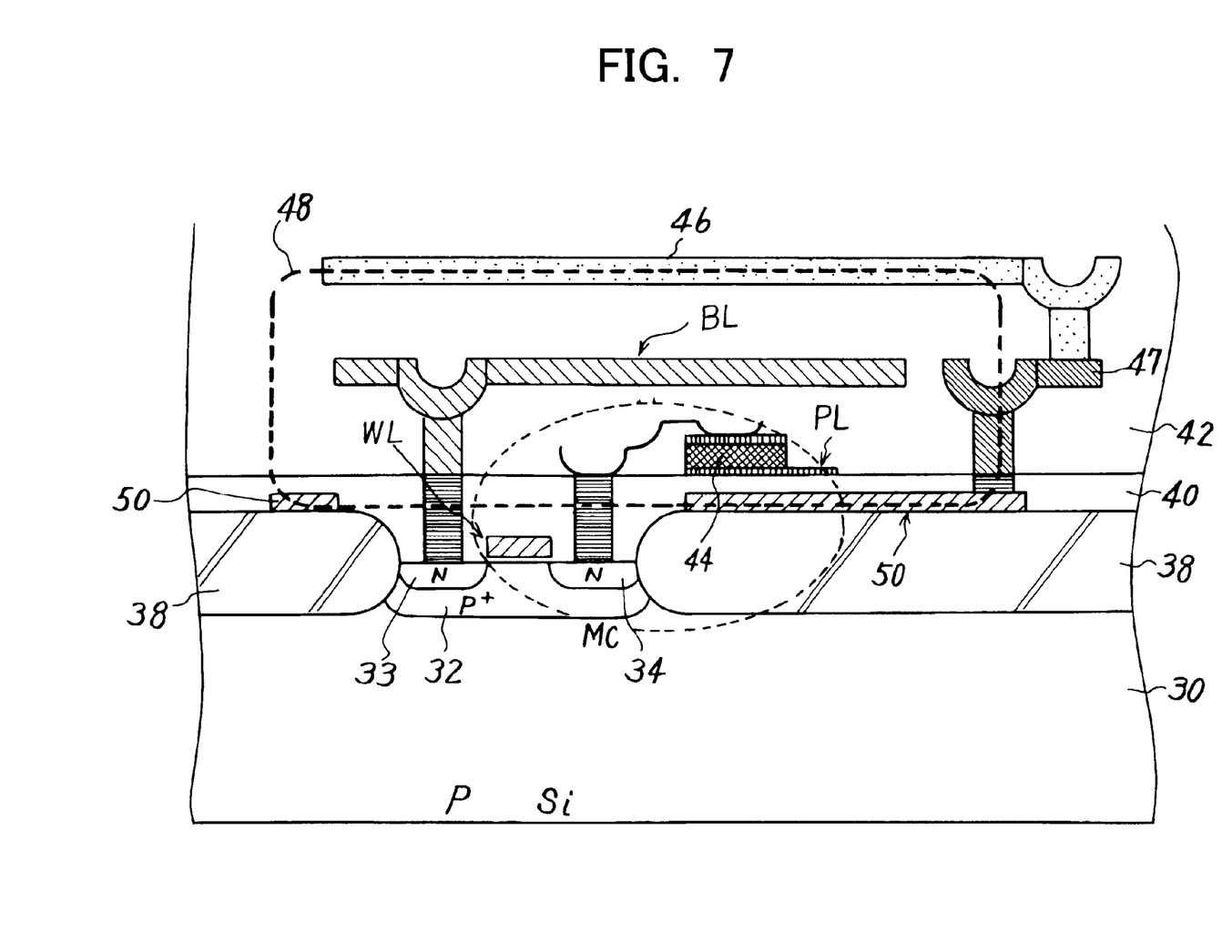
FIG. 7 is a diagram showing a cross-section of a portion of a ferroelectric memory structure in another aspect of the embodiment.

FIG. 7 is a diagram showing a cross-section of a portion of a ferroelectric memory structure in another aspect of the embodiment. In FIG. 7, the same reference numerals have been assigned to portions that are the same as those in FIGS. 5 and 6. In this example, an electromagnetic shield structure constitutes an electromagnetic wave shield layer 46 formed above a silicon semiconductor substrate 30 by a second aluminum layer, and a polysilicon layer 50 formed on the field oxide layer 38 formed on the surface of the substrate 30. As explained hereinabove, since the polysilicon layer on the substrate surface is also utilized as the gate (word line WL) of a memory cell transistor, the polysilicon layer 50, which constitutes the electromagnetic shield structure, is formed in a region, in which the memory cell transistor is not formed.

A polysilicon layer 50, which is connected to an electromagnetic wave shield layer 46 of an aluminum layer in particular, can be formed beneath a plate line PL, which constitutes the electrode of a ferroelectric capacitor. In each memory cell, a ferroelectric capacitor is formed together with a transistor. Therefore, in a memory cell region, in which there are formed a plurality of memory cells, there exists a region for forming ferroelectric capacitors, and a field oxide layer 38 is formed in this region. Therefore, by forming a polysilicon layer 50 for electromagnetic shield use on this field oxide layer 38, and connecting the layer 50 to an electromagnetic wave shield layer 46 comprising an upper aluminum layer, it is possible to form an electromagnetic wave shield structure 48, which interposes at the least a plate line PL and a bit line BL between upper and lower shield layers 46, 50. Further, the word line WL is shielded from electromagnetic waves by the upper shield layer 46.

Figure 8:
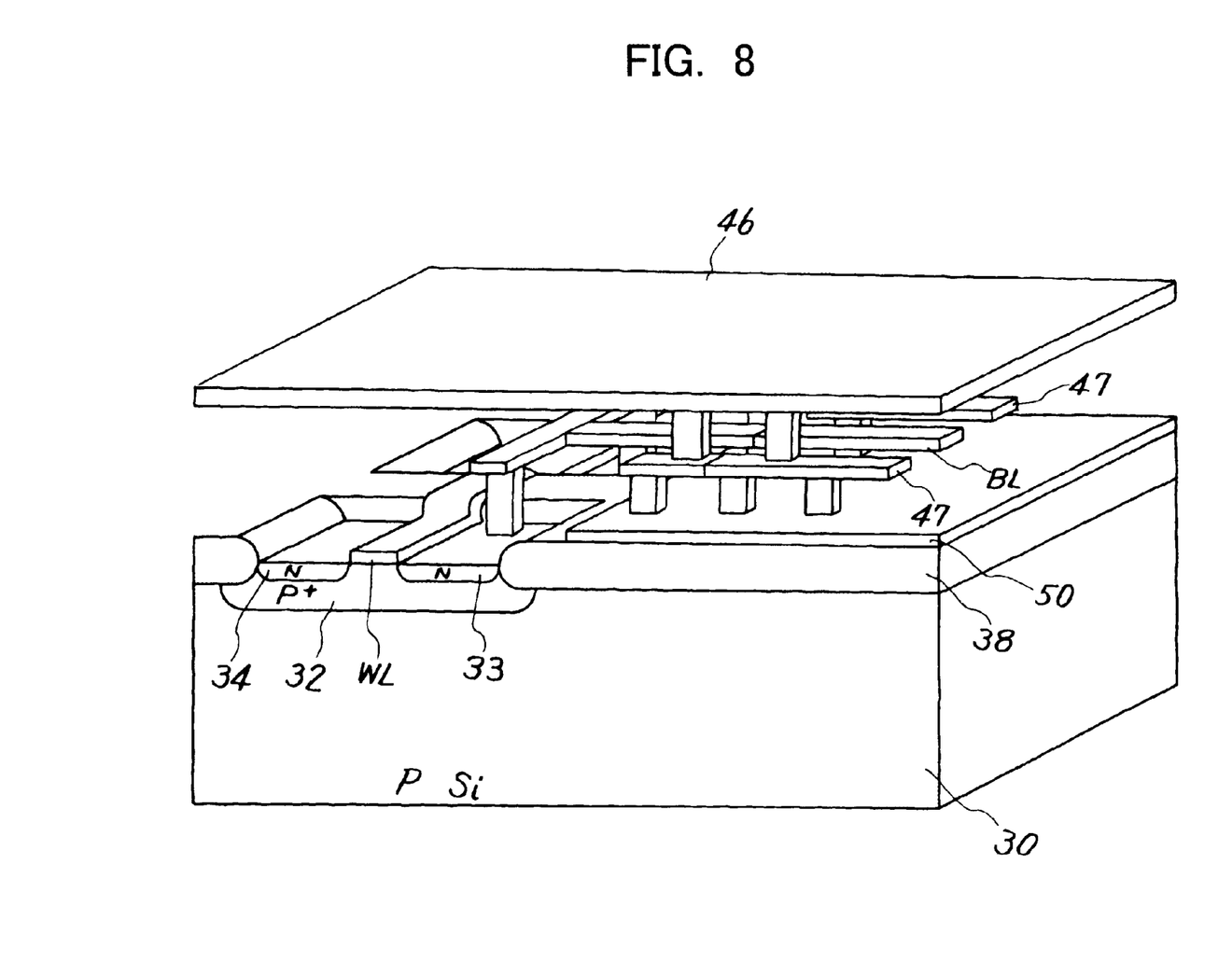
FIG. 8 is an oblique view showing the electromagnetic wave shield layer of FIG. 7.

FIG. 8 is an oblique view showing the electromagnetic wave shield layer of FIG. 7. The same reference numerals have been assigned to portions that are the same as those in FIG. 7. As shown in FIG. 8, the electromagnetic wave shield layer 46, which is formed by using a second aluminum layer, is connected, via a first aluminum layer 47, to the polysilicon layer 50 formed on the field oxide layer 38. Therefore, in the example of FIG. 8, by providing on both sides of a bit line BL formed by the first aluminum layer an aluminum layer 47, which is connected to the above-mentioned electromagnetic wave shield layer 46, it is possible to sandwich the bit line BL from top and bottom, and from right and left. Therefore, an electromagnetic wave shield structure can be provided in full measure to the bit line BL. Furthermore, the structure of a ferroelectric capacitor has been omitted in FIG. 8, but it is formed on the left side of the figure.

Figure 9:
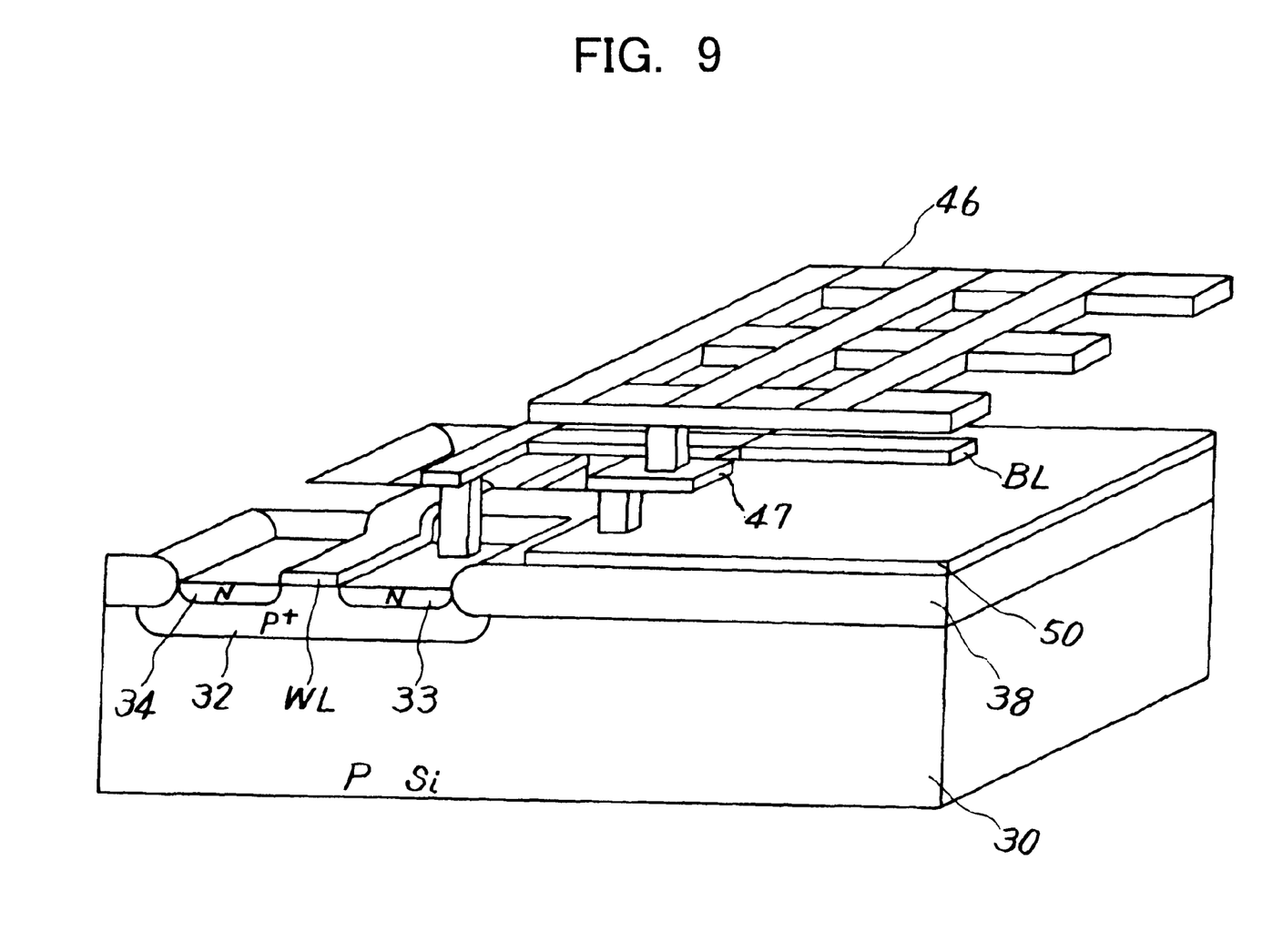
FIG. 9 is an oblique view showing the electromagnetic wave shield layer of FIG. 7.

FIG. 9 is another oblique view showing the electromagnetic wave shield layer of FIG. 7. In this example, too, an upper layer electromagnetic wave shield layer 46 is connected to the polysilicon layer 50 on a field oxide layer 38. Now, in the example of FIG. 9, the upper layer electromagnetic wave shield layer 46 is fabricated in the shape of a lattice. Even in the shape of a lattice, the electromagnetic wave shield layer 46 can sufficiently shield against electromagnetic waves. This electromagnetic wave shield layer 46 can also be fabricated in the shape of the teeth of a comb. That is, by removing the bars of one direction of the lattice shape of the electromagnetic wave shield layer 46 shown in FIG. 9, it is possible to make a comb-tooth shape.

Or, a shield layer 46 can be formed by a second aluminum layer in the shape of rectangle, in a direction that is perpendicular to a first aluminum layer 47 of the bit line direction shown in FIG. 8. In this case, the first aluminum layer 47 and the second aluminum layer 46 form a lattice shape. Or, a shield layer can be formed in a lattice shape by connecting the second aluminum layer to a third aluminum layer thereabove by forming a rectangle shape that extends in a perpendicular direction each other.

Figure 10:
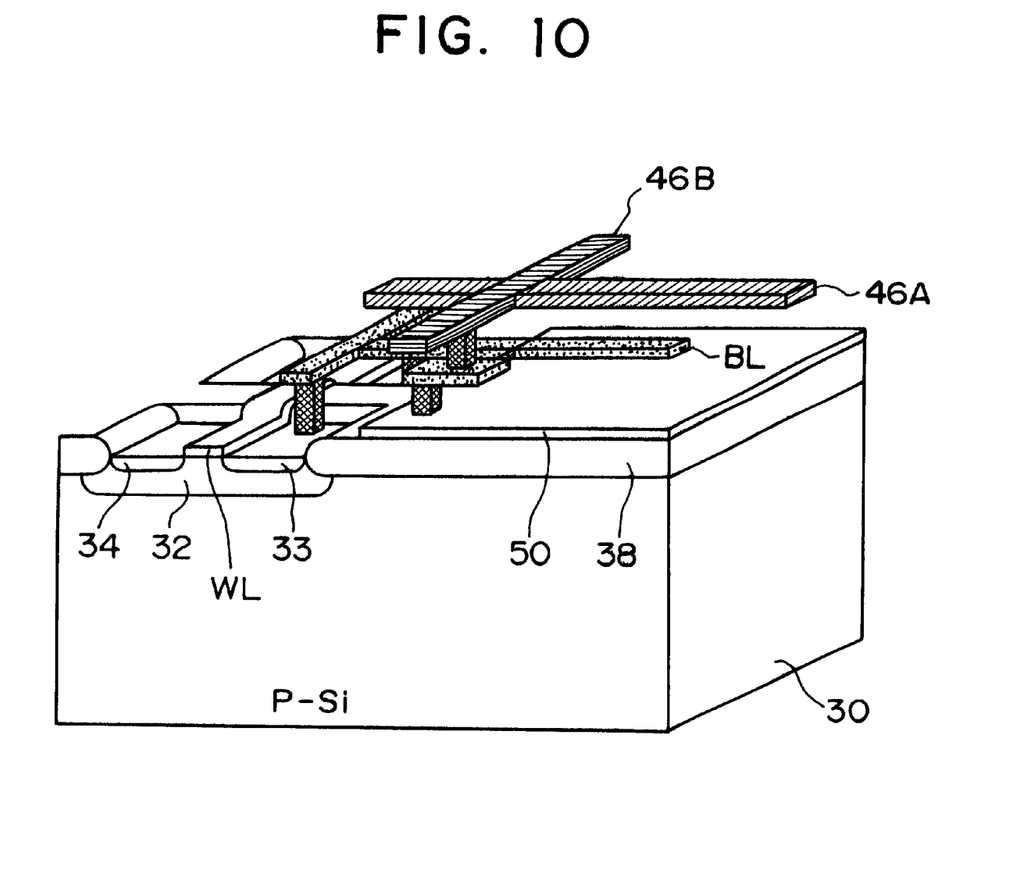
FIG. 10 is an oblique view showing an example of a variation of the electromagnetic wave shield layer of FIG. 7.
Figure 11:
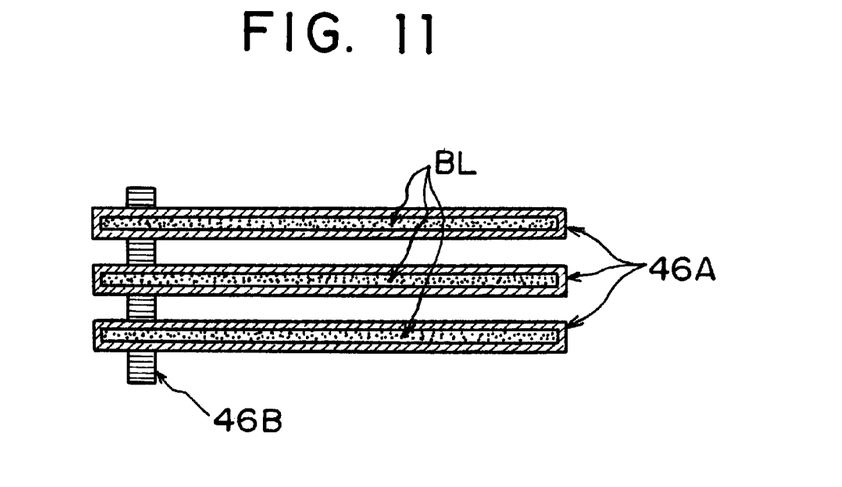
FIG. 11 is a plan view of a portion of the electromagnetic wave shield layer of FIG. 10.

FIG. 10 is an oblique view showing an example of a variation of the electromagnetic wave shield layer of FIG. 7. And FIG. 11 is a plan view of a portion thereof. In the example of FIGS. 10 and 11, a second aluminum layer is made into electromagnetic wave shield wires 46A of a line pattern, which is aligned with a plurality of bit lines BL provided in parallel. Then, a ground wire 46B, which is electrically connected to the plurality of electromagnetic wave shield wires 46A thereof, and is set to ground potential, is provided by making the same intersect the electromagnetic wave shield wires 46A. This ground wire 46B is connected to a ground power source together with another electromagnetic wave shield layer 50.

As shown in the plan view of FIG. 11, the pattern of the electromagnetic wave shield wires 46A is practically the same as the bit line BL pattern. In FIG. 11, for the sake of expediency, the width of the shield wires 46A are made wider than the width of the bit lines BL, but it is not absolutely necessary to make the shield wires 46A wide.

The example of FIGS. 10 and 11 is one in which the surface area of the electromagnetic wave shield layer can be reduced, and bit lines BL can be effectively shielded from outside electromagnetic waves. The advantage of reducing the surface area of the electromagnetic wave shield layer 46A in this fashion can be conceived of as follows. The ferroelectric material, which constitutes a ferroelectric capacitor, is ordinarily an oxide, making it undesirable for the material to be exposed to a reduction gas during a fabrication process. In the process for forming an electromagnetic wave shield layer 46A in particular, there are cases in which hydrogen and other reduction gases are generated. In this case, it is believed that making the surface area of the electromagnetic wave shield layer 46A smaller decreases the amount of reduction gases generated therefrom, and reduction gases can also be discharged via spaces between the electromagnetic wave shield wires, making it possible to reduce the chances of the ferroelectric material being exposed to the gases.

Providing line-shaped electromagnetic wave shield wires that align with the word line and plate line, in addition to the bit line, can be expected to have the same effect.

The electromagnetic wave shield layer 46 described in the above-mentioned embodiment is not limited to the shapes thereof. Any shape will do, so long as it is one that is capable of properly shielding against electromagnetic waves.

According to the present invention described above, since an electromagnetic wave shield structure is formed in the memory cell region of a ferroelectric memory, the word line, plate line, bit lines inside the memory cell region are not exposed to high energy electromagnetic waves, and pursuant thereto, it is also possible to prevent a change in the storage state of a memory cell. Therefore, even if such a ferroelectric memory chip, or a microprocessor equipped therewith, is housed inside an IC card, which is connected to an input-output device in a non-contact fashion via electromagnetic waves, the destruction of memory stored data by electromagnetic waves is prevented.

Further, an electromagnetic wave shield structure such as this is expected to prove effective even against unauthorized access, in which an attempt is made to read ferroelectric memory stored data, and signals inside an IC card using a tester, which makes use of an electron beam.

What is claimed is:

1. A ferroelectric memory comprising:
   a memory cell region, in which are provided a plurality of memory cells, each having a ferroelectric capacitor;
   a first eletromagnetic wave shield layer formed over said memory cell region;
   bit lines formed under the first electromagnetic wave shield layer;
   word lines formed under the bit lines;
   plate lines, formed under the bit lines, as electrodes of the ferroelectric capacitors; and
   a second electromagnetic wave shield layer formed under the plate lines and over a field oxide layer;
   wherein the first electromagnetic wave shield layer covers the bit lines, the word lines and the plate lines from upper side, the second electromagnetic wave shield layer covers the plate lines from lower side, and the first and second electromagnetic wave shield layers are connected electrically.

2. The ferroelectric memory according to claim 1, wherein said electromagnetic wave shield layer is a conductive layer.

3. The ferroelectric memory according to claim 2, wherein said conductive layer is either a metallic layer of a polycrystalline silicon layer.

4. The ferroelectric memory according to claim 1, 2 or 3 wherein said electromagnetic wave shield layer has a lattice shape, comb-tooth shape, or a prescribed electromagnetic wave shield shape.

5. The ferroelectric memory according to claim 1, wherein said electromagnetic wave shield layer is a conductive layer whose electric potential is fixed.

6. The ferroelectric memory according to claim 1, wherein said word lines and said second electromagnetic wave shield layer is formed by the same conductive layer.

7. An IC card comprising:
   a card case; and
   said ferroelectric memory according to claim 1, 2, 3 or 5 which is mounted in the card case.

8. The IC card according to claim 7, further comprising:
   an electromagnetic wave antenna, connected to said ferroelectric memory, for supplying a power or for transmitting/receiving data.

* * * * *